United States Patent
Zhang

(10) Patent No.: US 9,711,577 B2
(45) Date of Patent: Jul. 18, 2017

(54) OLED DISPLAY DEVICE AND FABRICATION METHOD THEREOF

(71) Applicant: BOE TECHNOLOGY GROUP CO., LTD., Beijing (CN)

(72) Inventor: Peng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 13 days.

(21) Appl. No.: 14/652,647

(22) PCT Filed: Oct. 30, 2014

(86) PCT No.: PCT/CN2014/089908
§ 371 (c)(1),
(2) Date: Jun. 16, 2015

(87) PCT Pub. No.: WO2016/004709
PCT Pub. Date: Jan. 14, 2016

(65) Prior Publication Data
US 2016/0260789 A1    Sep. 8, 2016

(30) Foreign Application Priority Data
Jul. 9, 2014 (CN) .......................... 2014 1 0325827

(51) Int. Cl.
*H01L 51/52* (2006.01)
*H01L 27/32* (2006.01)
(Continued)

(52) U.S. Cl.
CPC ...... *H01L 27/3258* (2013.01); *H01L 27/3248* (2013.01); *H01L 27/3262* (2013.01);
(Continued)

(58) Field of Classification Search
CPC ............. H01L 27/3258; H01L 51/0021; H01L 27/3262; H01L 51/0017; H01L 27/3248; H01L 51/5203; H01L 51/56
See application file for complete search history.

(56) References Cited

U.S. PATENT DOCUMENTS 7,903,055 B2 * 3/2011 Nishikawa .......... H01L 51/5209
257/40
8,241,935 B2 8/2012 Jeong et al.
(Continued)

FOREIGN PATENT DOCUMENTS

CN    1514276 A    7/2004
CN    1947464 A    4/2007
(Continued)

OTHER PUBLICATIONS

International Search Report of PCT/CN2014/089908 in Chinese, mailed Mar. 30, 2015 with English translation.
(Continued)

*Primary Examiner* — Donald Raleigh
(74) *Attorney, Agent, or Firm* — Collard & Roe, P.C.

(57) ABSTRACT

An organic light emitting diode (OLED) display device (01) and a fabrication method thereof are provided. The OLED display device (01) comprises a plurality of sub-pixel units, and each of the sub-pixel units includes a first electrode (20), an organic material functional layer (30) and a second electrode (40) which are sequentially disposed on a base substrate (10). The sub-pixel unit further includes: a first buffer layer (50) disposed between the base substrate (10) and the first electrode (20). A surface of a part, corresponding to the first electrode (20), of the first buffer layer (50) on a side away from the base substrate (10) is in a concave
(Continued)

shape; the first electrode (20) is a transparent electrode, and the second electrode (40) is a non-transparent metal electrode.

20 Claims, 3 Drawing Sheets

(51) Int. Cl.
    *H01L 51/56* (2006.01)
    *H01L 51/00* (2006.01)

(52) U.S. Cl.
    CPC ...... *H01L 51/0017* (2013.01); *H01L 51/0021* (2013.01); *H01L 51/5203* (2013.01); *H01L 51/5209* (2013.01); *H01L 51/5225* (2013.01); *H01L 51/5271* (2013.01); *H01L 51/56* (2013.01)

(56) References Cited

U.S. PATENT DOCUMENTS

| | | | |
|---|---|---|---|
| 2010/0181554 A1* | 7/2010 | Yoshida | H01L 51/5209 257/40 |
| 2012/0049175 A1* | 3/2012 | Ono | H01L 27/3246 257/40 |
| 2014/0001450 A1* | 1/2014 | Shinotsuka | H01L 51/5225 257/40 |
| 2014/0097415 A1* | 4/2014 | Byun | H05B 33/0896 257/40 |
| 2014/0312319 A1* | 10/2014 | Kim | H01L 27/3258 257/40 |

FOREIGN PATENT DOCUMENTS

| | | |
|---|---|---|
| CN | 103000823 A | 3/2013 |
| CN | 104103673 A | 10/2014 |
| CN | 204167324 U | 2/2015 |
| JP | 2005-331665 A | 12/2005 |

OTHER PUBLICATIONS

Notice of Transmittal of the International Search Report of PCT/CN2014/089908 in Chinese, mailed Mar. 30, 2015.

Written Opinion of the International Searching Authority of PCT/CN2014/089908 in Chinese, mailed Mar. 30, 2015 with English translation.

Chinese Office Action in Chinese Application No. 201410325827.X, mailed Jun. 14, 2016 with English translation.

Second Chinese Office Action in Chinese Application No. 201410325827.X, mailed Dec. 7, 2016 with English translation.

* cited by examiner

OLED DISPLAY DEVICE AND FABRICATION METHOD THEREOF

CROSS REFERENCE TO RELATED APPLICATIONS

This application is the National Stage of PCT/CN2014/089908 filed on Oct. 30, 2014, which claims priority under 35 U.S.C. §119 of Chinese Application No. 201410325827.X filed on Jul. 9, 2014, the disclosure of which is incorporated by reference.

TECHNICAL FIELD

Embodiments of the invention relate to an OLED display device and a fabrication method thereof.

BACKGROUND

An organic light emitting diode (OLED) display device is an organic thin film electroluminescent device having advantages such as a simple preparation process, a low cost, easy formation of a flexible structure and a wide viewing angle, so a display technology using the organic light emitting diode has become an important display technology.

Structurally, the OLED can be divided into a top-emitting OLED display device and a bottom-emitting OLED display device. For the bottom-emitting OLED display device, as illustrated in FIG. 1, it comprises a transparent anode 11, an organic material functional layer 30 and a non-transparent metal cathode 12 which are sequentially disposed on a base substrate 10. Because an anode of the bottom-emitting OLED display device is transparent, a micro-cavity effect is not obvious in the bottom-emitting OLED display device, and a viewing angle thereof is greater than that of the top-emitting OLED display device.

However, although the viewing angle of the bottom-emitting OLED display device is greater than that of the top-emitting OLED display device, in actual application, it is still hoped that the OLED display device can have a greater viewing angle to meet needs of different viewing angles.

SUMMARY OF THE INVENTION

An embodiment according to the present invention provides an OLED display device, comprising a plurality of sub-pixel units, each of the sub-pixel units including a first electrode, an organic material functional layer and a second electrode which are sequentially disposed on a base substrate, wherein the sub-pixel unit further includes a first buffer layer disposed between the base substrate and the first electrode;

a surface of a part, corresponding to the first electrode, of the first buffer layer on a side away from the base substrate, is in a concave shape; and the first electrode is a transparent electrode, and the second electrode is a non-transparent metal electrode.

In an example, the first electrode, the organic material functional layer and the second electrode are conformally formed on a concave portion of the first buffer layer.

In an example, a surface of the concave portion of the first buffer layer is a curved surface bending toward a side of the base substrate.

In an example, the curved surface is an arc-shaped surface.

In an example, a thickness of the first buffer layer is 2 µm~5 µm.

In an example, a material of the first buffer layer includes polyimide.

In an example, the sub-pixel unit further includes a thin film transistor disposed between the base substrate and the first buffer layer.

In an example, the first electrode is at least electrically connected with a drain electrode of the thin film transistor through a via hole disposed on the first buffer layer.

In an example, the OLED display device further comprises a second buffer layer disposed between the base substrate and the thin film transistor, and the second buffer layer is in contact with the base substrate.

In an example, a material of the second buffer layer includes at least one of silicon oxide and silicon nitride.

Another embodiment according to the present invention provides a fabrication method of an OLED display device, and the OLED display device including a plurality of sub-pixel units, the method comprising:

forming a first buffer layer on a base substrate; wherein in a region corresponding to the first electrode in each of the sub-pixel units, a surface of the first buffer layer on a side away from the base substrate is in a concave arc shape;

forming a first electrode, an organic material functional layer and a second electrode sequentially, in a region of each of the sub-pixel units, on a substrate where the first buffer layer has been formed, wherein, the first electrode is a transparent electrode, and the second electrode is a non-transparent metal electrode.

In an example, forming the first buffer layer on the base substrate includes:

forming a first buffer layer film on the base substrate;

with a patterned effect of a graphical mask, performing a dry etching on a first buffer layer film corresponding to an opening of the mask, to form the first buffer layer with a concave shape on the surface, wherein, the opening of the mask is corresponding to a predetermined region of the sub-pixel unit, and an area of the opening on a side close to the first buffer layer film is greater than an area on a side away from the first buffer layer film.

In an example, the method further comprises, forming a thin film transistor between the base substrate and the first buffer layer, in each of the sub-pixel units.

In an example, the dry etching performed on the first buffer layer film includes a plasma etching.

In the embodiments of the present invention, a surface of a part, corresponding to the first electrode, of the first buffer layer on a side away from the base substrate is made to form a concave arc shape, so that a surface of the second electrode forms a concave arc shape; and thus, when light emitted from a light emitting layer of an organic material function layer arrives at a surface of the non-transparent second electrode, reflected light is more divergently emitted out from a side of the transparent first electrode, thereby increasing an emission ratio of the light from different angles, further increasing a viewing angle and a luminous intensity of the OLED display device.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
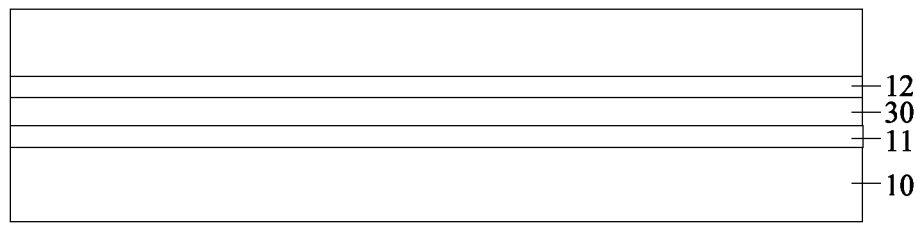
FIG. 1 is a structural schematic diagram of an OLED display device in the prior art.
Figure 2:
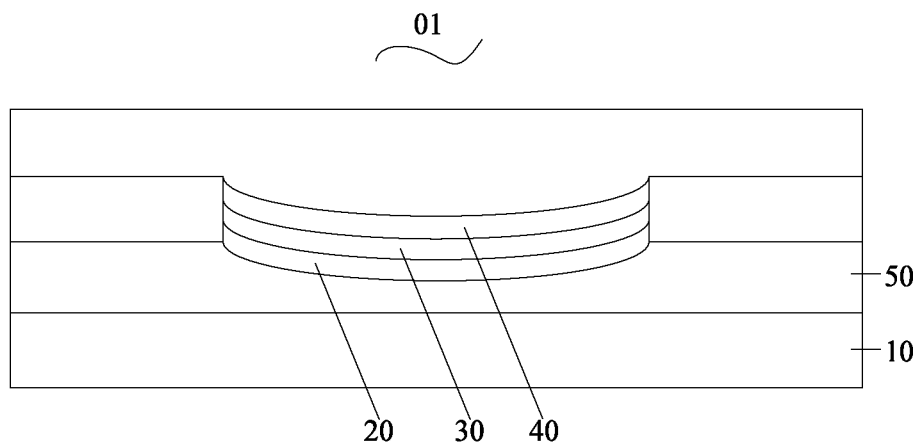
FIG. 2 is a structural schematic diagram I of an OLED display device provided by an embodiment of the present invention.
Figure 3:
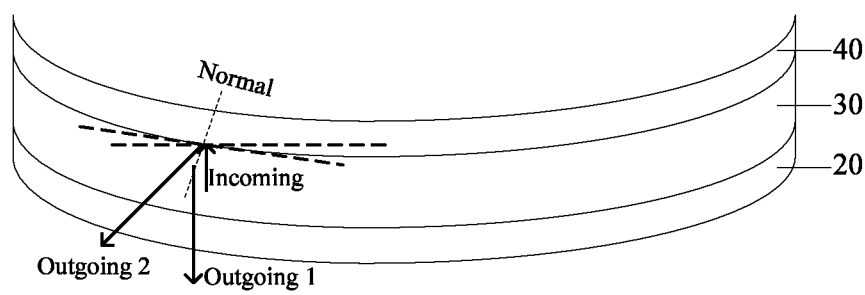
FIG. 3 is a schematic diagram of an OLED display device provided by the embodiment of the present invention realizing an increase in a viewing angle of outgoing light.

An embodiment of the present invention provides an OLED display device 01; as illustrated in FIG. 2 and FIG. 3, the OLED display device 01 comprises a plurality of sub-pixel units, each of the sub-pixel units including a first electrode 20, an organic material functional layer 30 and a second electrode 40 which are sequentially disposed on a base substrate 10; and the sub-pixel unit further includes a first buffer layer 50 disposed between the base substrate 10 and the first electrode 20. A surface of a part, corresponding to the first electrode 20, of the first buffer layer 50 away from the base substrate 10 is in a concave arc shape; the first electrode 20 is a transparent electrode, and the second electrode 40 is a non-transparent metal electrode. The arc-shaped concave portion herein refers to that a surface of the concave portion of the first buffer layer 50 is an arc-shaped surface bending toward a side of the base substrate. However, according to the embodiment of the present invention, it is not limited to a strictly arc-shaped surface; and the surface of the concave portion of the first buffer layer 50 may be any suitable curved surface bending toward the side of the base substrate or in other suitable shapes.

For a traditional bottom-emitting OLED display device, an interface between the organic material function layer 30 and the second electrode 40 is a plane, and the light emitted from a light emitting layer of the organic material function layer 30 is irradiated to a surface of the second electrode 40 in a direction approximately perpendicular to the interface, so the reflected light is also emitted out from the second electrode 20 in the direction perpendicular to the interface, i.e., outgoing light 1 in FIG. 3, for example. As for the bottom-emitting OLED display device provided by the present invention, since the interface between the organic material function layer 30 and the second electrode 40 is an arched interface convex to the first electrode 20. That is to say, the first electrode 20, the organic material functional layer 30 and the second electrode 40 are conformally formed on the concave portion of the first buffer layer, so a shape bending toward the side of the base substrate is surely formed. In this case, the light emitted from the light emitting layer of the organic material function layer 30 is irradiated to the surface of the second electrode 40 in a same direction (a vertical direction), and a certain incoming angle is formed between the incoming light and a normal direction; according to the reflection principle, the reflected light is also emitted out from the second electrode 20 at a certain angle, i.e., outgoing light 2 in FIG. 3, for example.

Thus, it can be seen that, when the shape of the surface of the non-transparent second electrode 40 on a side close to the organic material function layer 30 is changed, after the light is reflected by the second electrode 40, and emitted out from the first electrode 20, the light outgoing angle thereof is more divergent, thereby increasing an emission ratio of the light from different angles, further increasing a viewing angle of the OLED display device 01.

It should be noted that, the material of the first buffer layer 50 is not defined here, as long as it can form a concave arc shape on a surface thereof on a side away from the base substrate 10.

When the first buffer layer 50 is made of a conductive material, it is required to dispose an insulating layer between the first buffer layer 50 and the first electrode 20, which depends on the actual situation, and will not be repeated here.

Since the first buffer layer 50 is below the first electrode 20, that is, the first buffer layer 50 located below should be fabricated at first, while the first electrode 20 located above should be fabricated later, in a case where an upper surface of a part, corresponding to the first electrode 20, of the first buffer layer 50 is in a concave arc shape, the first electrode 20 formed thereon is also in a concave arc shape; similarly, the organic material functional layer 30 and the second electrode 40 located above the first electrode 20 are also in a concave arc shape.

The first electrode 20 may be an anode or a cathode, and the second electrode 40 may be a cathode or an anode. That is, if the first electrode 20 is an anode, the second electrode 40 is a cathode; and if the first electrode 20 is a cathode, the second electrode 40 is an anode.

The organic material functional layer 30 may at least include a light emitting layer, and may further include an electron transport layer and a hole transport layer; on such basis, in order to improve injection efficiency of electrons and holes into the light emitting layer, the organic material functional layer 30 may further include an electron injection layer disposed between the cathode and the electron transport layer, and a hole injection layer disposed between the hole transport layer and the anode.

On this basis, when operating voltages are applied to the anode and the cathode, the holes in the anode and the electrons in the cathode are all injected into the light emitting layer; the holes and the electrons are recombined in the light emitting layer and release energy; the energy is emitted in the form of light, and the light passes through different luminescent materials in the light emitting layer to show different colors, and emitted uniformly from both sides of the organic material functional layer 30.

The light emitting layer of three sub-pixel unit in a pixel unit may separately include red, green, and blue luminescent materials; of course, the light emitting layer may only include a white luminescent material, which is not defined here.

The OLED display device 01 may be a passive matrix display device, or an active matrix display device, which are not defined here.

In the embodiment of the present invention, adjacent first electrodes 20 may be separated by a pixel separation layer, which will be not repeated here.

Pattern layers associated with the gist of the invention are schematically illustrated in the drawings of all embodiments of the present invention, while pattern layers which are not immediately associated with the gist of the invention are not illustrated or only illustrated partially.

The embodiment of the present invention provides an OLED display device 01, comprising a plurality of sub-pixel units, each of the sub-pixel units including a first electrode 20, an organic material functional layer 30 and a second electrode 40 which are sequentially disposed on a base substrate 10; the sub-pixel unit further includes a first buffer layer 50 disposed between the base substrate 10 and the first electrode 20. A surface of a part, corresponding to the first electrode 20, of the first buffer layer 50 on a side away from the base substrate 10 is in a concave arc shape; the first electrode 20 is a transparent electrode, and the second electrode 40 is a non-transparent metal electrode.

In the embodiment of the present invention, a surface of a part, corresponding to the first electrode 20, of the first buffer layer 50 on a side away from the base substrate 10 is made to form a concave arc shape, so that a surface of the second electrode 40 forms a concave arc shape; and thus, when light emitted from a light emitting layer of an organic material function layer 30 arrives at a surface of the non-transparent second electrode 40, reflected light is more divergently emitted out from a side of the transparent first electrode 20, thereby increasing an emission ratio of the light from different angles, further increasing a viewing angle and a luminous intensity of the OLED display device 01.

For example, a thickness of the first buffer layer 50 is 2 nm-5 nm.

In this way, the OLED display 01 is neither too thick to meet the market demands for thinning, nor too thin to fabricate the first buffer layer 50 with a concave arc-shaped surface.

For example, a material of the first buffer layer 50 may be polyimide (PI).

This is because the structure of PI is not compact, when the first buffer layer 50 with a concave arc-shaped surface is fabricated, for example, by dry etching, it is easy to etch away the PI material in the region to be made concave, and etch out an expected result.

Figure 4:
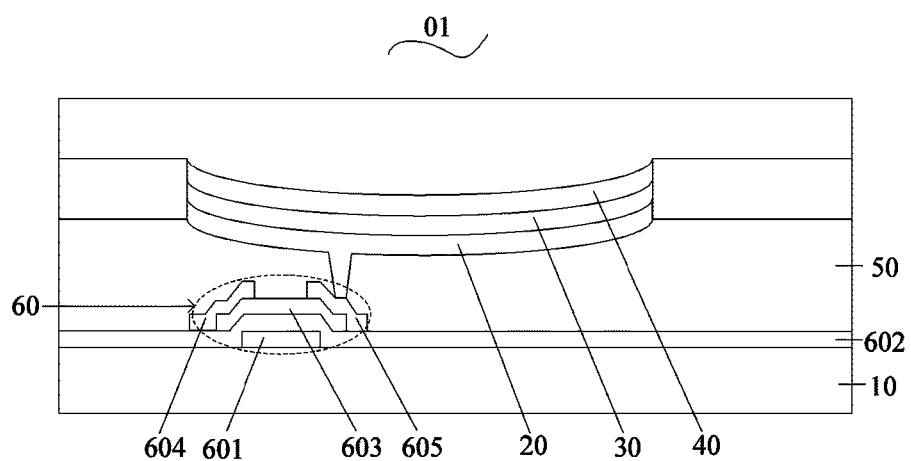
FIG. 4 is a structural schematic diagram II of an OLED display device provided by the embodiment of the present invention.

Based on the above, considering that a passive matrix has its insufficient aspect when applied to a large-sized display device, for example, the OLED display device 01 provided by the embodiment of the present invention is an active matrix OLED display device, i.e., as illustrated in FIG. 4, each sub-pixel unit of the OLED display device 01 further includes a thin film transistor 60 disposed between the base substrate 10 and the first buffer layer 50.

The thin film transistor 60 includes a gate electrode 601, a gate insulating layer 602, a semiconductor active layer 603, a source electrode 604 and a drain electrode 605; and the thin film transistor 60 may be of a top gate type or a bottom gate type.

Of course, the OLED display device 01 further comprises a gate line, a gate line lead (not illustrated) electrically connected with the gate electrode 601, and a data line, and a data line lead (not illustrated) electrically connected with the source electrode 604.

Further, considering that, if the drain electrode 605 is electrically connected with the second electrode 40, the second electrode 40 must pass through the organic material functional layer 30 and the first electrode 20, to be electrically connected with the drain electrode 605, so that on one hand, a short circuit may occur between the second electrode 40 and the first electrode 20, and on the other hand, a preparation process is also relatively complex due to specificity of the material of the organic material functional layer 30. On this basis, in the embodiment of the present invention, for example, the drain electrode 605 is electrically connected with the first electrode 20, and the first electrode 20 is electrically connected with the drain electrode 605 of the thin film transistor through a via hole disposed in the first buffer layer 50.

Figure 5:
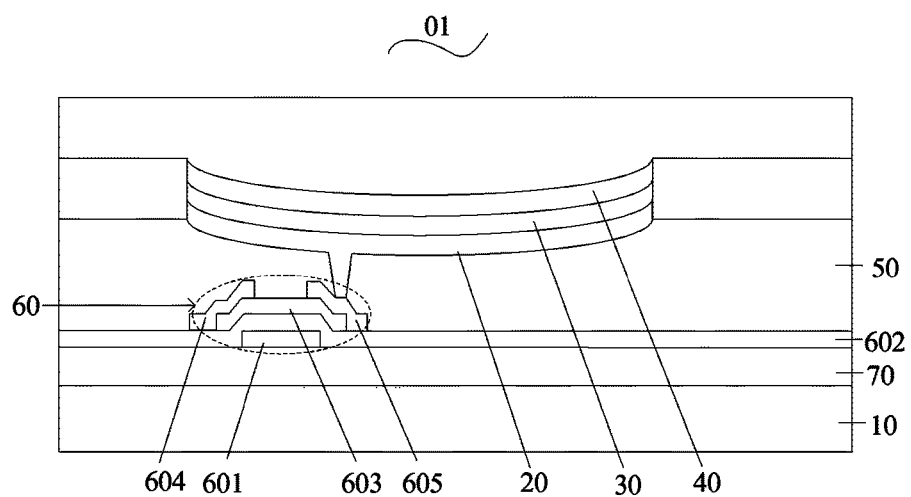
FIG. 5 is a structural schematic diagram III of an OLED display device provided by the embodiment of the present invention.

For example, as illustrated in FIG. 5, the OLED display device 01 further comprises a second buffer layer 70 disposed between the base substrate 10 and the thin film transistor 60, and the second buffer layer 70 is in contact with the base substrate 10.

The second buffer layer 70 can be of a monolayer or multilayer structure, and made from, for example, silicon nitride (SiN), silicon dioxide (SiOx) and so on.

With the second buffer layer 70, it is helpful to improve the surface smoothness and adhesion of the base substrate 10, and also helpful to improve the resistance to water and oxygen permeability.

It should be noted that, due to the specificity of the material of the organic material functional layer 30, in the embodiment of the present invention, the OLED display device 01 further comprises a packaging layer for packaging the organic material; wherein, the packaging layer may be of thin film packaging or substrate packaging, which is not defined here.

An embodiment of the present invention further provides a fabrication method of an OLED display device, and the OLED display device includes a plurality of sub-pixel units. The method comprises the following steps.

S10: as illustrated in FIG. 2, forming a first buffer layer 50 on a base substrate 10; wherein in a region corresponding to the first electrode 20 in each of the sub-pixel units, a surface of the first buffer layer 50 on a side away from the base substrate 10 is in a concave arc shape.

S11: as illustrated in FIG. 2, forming a first electrode 20, an organic material functional layer 30 and a second electrode 40 sequentially, in a region of each of the sub-pixel units, on a substrate where the first buffer layer 50 has been formed.

The first electrode 20 is a transparent electrode, and the second electrode 40 is a non-transparent metal electrode.

It should be noted that, the method for forming the first buffer layer 50 with a concave arc shape on the surface is not limited here.

Since the first buffer layer 50 is fabricated at first, and then the first electrode 20 is fabricated above the first buffer layer 50, in a case where an upper surface of a part, corresponding to the first electrode 20, of the first buffer layer 50 is in a concave arc shape, the first electrode 20 formed thereon is also in a concave arc shape; similarly, the organic material functional layer 30 and the second electrode 40 located above the first electrode 20 are also in a concave arc shape.

The embodiment of the present invention further provides a fabrication method of an OLED display device which includes a plurality of sub-pixel units, comprising: forming a first buffer layer 50 on a base substrate 10; wherein in a region corresponding to the first electrode 20 in each of the sub-pixel units, a surface of the first buffer layer 50 on a side away from the base substrate 10 is in a concave arc shape; forming a first electrode 20, an organic material functional layer 30 and a second electrode 40 sequentially, in a region of each of the sub-pixel units, on a substrate where the first buffer layer 50 has been formed; wherein the first electrode 20 is a transparent electrode, and the second electrode 40 is a non-transparent metal electrode.

In the embodiment of the present invention, a surface of a part, corresponding to the first electrode 20, of the first buffer layer 50 on a side away from the base substrate 10 is made to form a concave arc shape, so that a surface of the second electrode 40 forms a concave arc shape; and thus, when light emitted from a light emitting layer of an organic material function layer 30 arrives at a surface of the non-transparent second electrode 40, reflected light is more divergently emitted out from a side of the transparent first electrode 20, thereby increasing an emission ratio of the light from different angles, further increasing a viewing angle and a luminous intensity of the OLED display device 01.

For example, the above step S10 specifically may include the following steps.

Figure 6:
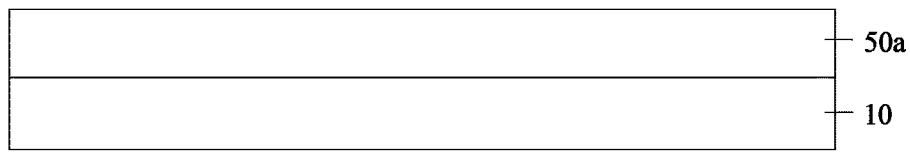
FIG. 6 to FIG. 8 are schematic diagrams of a process of forming a first buffer layer with a concave arc shape on the surface, provided by an embodiment of the present invention.

Step 101: as illustrated in FIG. 6, forming a first buffer layer film 50a on the base substrate 10.

Because the structure of PI is not compact, when the first buffer layer 50 with a concave arc-shaped surface is fabricated, for example, by dry etching, it is easy to etch away the PI material in the region to be made concave, and etch out an expected result. Thus, the first buffer layer film is made of PI material.

Figure 7:
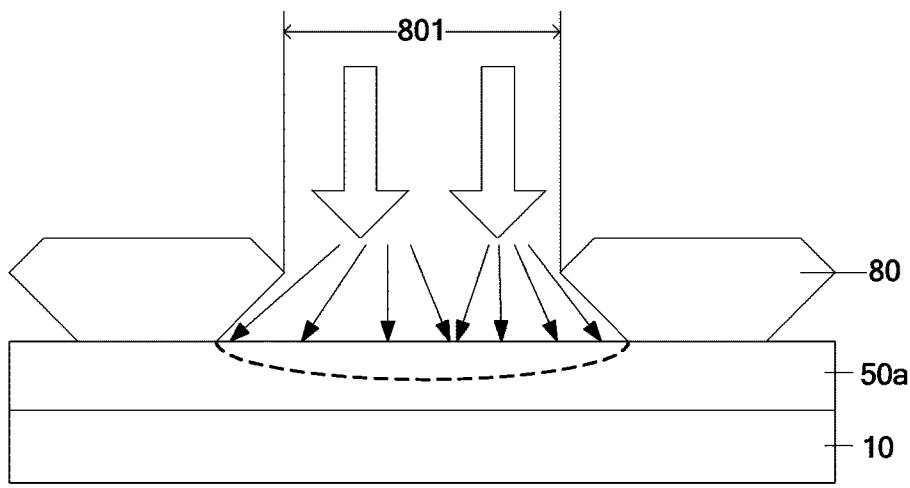
Figure 8:
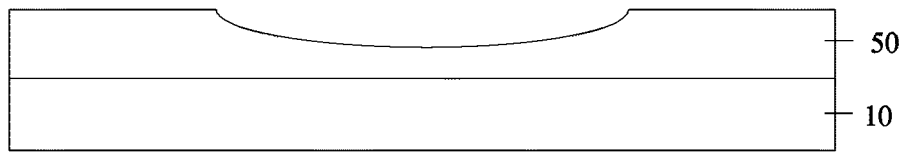

S102: as illustrated in FIG. 7, with a shielding effect of a graphical mask 80, performing a dry etching on the first buffer layer film 50a corresponding to an opening 801 of the mask, to form the first buffer layer 50 with a concave arc shape on surface as illustrated in FIG. 8.

The opening 801 of the mask is corresponding to a predetermined region of the sub-pixel unit, and an area of the opening 801 on a side close to the first buffer layer film 50a is greater than an area on a side away from the first buffer layer film 50a.

It should be noted that, the dry etching is a technology of etching film by using plasma; on such basis, in the embodiment of the present invention, a mask 80 in a shape as illustrated in FIG. 7 is used for shielding, that is, with a shadow effect of the mask 80, concentration of plasma in a region vertically shielded by the mask 80 is lower, so the closer to an edge of the mask 80, the poorer the etching effect is, and the shallower the etched arc structure is; in a region directly facing the opening of the mask 801, because the plasma can directly goes into, the concentration of plasma is higher, the etching effect is more obvious, and the etching depth is deeper.

A predetermined region refers to a region having a depth greater than a certain concave depth, in a region, corresponding to the first electrode 20, of each of the sub-pixel units.

The dry etching performed on the first buffer layer film 50a corresponding to the opening 801 of the mask refers to that, for the plasma that enters from the opening 801, as long as there is a space between the mask 80 and the first buffer layer film 50a, the plasma can arrive, then the first buffer layer film 50a can be etched.

For example, a thickness of the first buffer layer 50 is 2 μm~5 μm.

In this way, the OLED display 01 is neither too thick to meet the market demands for thinning, nor too thin to fabricate the first buffer layer 50 with a concave arc-shaped surface.

For example, a material of the first buffer layer 50 may be polyimide.

Based on the above, considering that, a passive matrix has its insufficient aspect when applied to a large-sized display device, for example, the OLED display device 01 provided by the embodiment of the present invention is an active matrix OLED display device, i.e., as illustrated in FIG. 4, each sub-pixel unit of the OLED display device 01 further includes a thin film transistor 60 disposed between the base substrate 10 and the first buffer layer 50.

The thin film transistor 60 includes a gate electrode 601, a gate insulating layer 602, a semiconductor active layer 603, a source electrode 604 and a drain electrode 605; and the thin film transistor 60 may be of a top gate type or a bottom gate type.

Further, the first electrode 20 is at least electrically connected with a drain electrode 605 of the thin film transistor through a via hole disposed on the first buffer layer 50.

For example, as illustrated in FIG. 5, the method further comprises: forming a second buffer layer 70 between the base substrate 10 and the thin film transistor 60, and the second buffer layer 70 is in contact with the base substrate 10. The second buffer layer 70 can be of a monolayer or multilayer structure, and made from, for example, silicon nitride (SiN), silicon dioxide (SiOx) and so on.

With the second buffer layer 70, it is helpful to improve the surface smoothness and adhesion of the base substrate 10, and also helpful to improve the resistance to water and oxygen permeability.

The above are only specific embodiments of the present application, but the scope of the invention is not limited thereto, and any skilled in the art, within the technical scope disclosed by the invention, can easily think of variations or replacements, which should be covered within the protection scope of the invention. Therefore, the scope of the present invention should be the scope of the following claims.

The foregoing embodiments merely are exemplary embodiments of the invention, and not intended to define the scope of the invention, and the scope of the invention is determined by the appended claims.

The present application claims priority of Chinese Patent Application No. 201410325827.X filed on Jul. 9, 2014, the disclosure of which is incorporated herein by reference in its entirety as part of the present application.

What is claimed is:

1. An OLED display device, comprising a plurality of sub-pixel units, each of the sub-pixel units including a first electrode, an organic material functional layer and a second electrode which are sequentially disposed on a base substrate, wherein the sub-pixel unit further includes a first buffer layer disposed between the base substrate and the first electrode;

a surface of a part, corresponding to the first electrode, of the first buffer layer on a side away from the base substrate, is in a concave shape; and the first electrode is a transparent electrode, and the second electrode is a non-transparent metal electrode, wherein, in a direction parallel to the base substrate, the first electrode and the concave shape have a same size.

2. The OLED display device according to claim 1, wherein the first electrode, the organic material functional layer and the second electrode are conformally formed on a concave portion of the first buffer layer.

3. The OLED display device according to claim 1, wherein a surface of the concave portion of the first buffer layer is a curved surface bending toward a side of the base substrate.

4. The OLED display device according to claim 3, wherein the curved surface is an arc-shaped surface.

5. The OLED display device according to claim 1, wherein a thickness of the first buffer layer is 2 μm~5 μm.

6. The OLED display device according to claim 1, wherein a material of the first buffer layer includes polyimide.

7. The OLED display device according to claim 1, wherein the sub-pixel unit further includes a thin film transistor disposed between the base substrate and the first buffer layer.

8. The OLED display device according to claim 7, wherein the first electrode is at least electrically connected with a drain electrode of the thin film transistor through a via hole disposed on the first buffer layer.

9. The OLED display device according to claim 7, wherein the OLED display device further comprises a second buffer layer disposed between the base substrate and the thin film transistor, and the second buffer layer is in contact with the base substrate.

10. The OLED display device according to the claim 9, wherein a material of the second buffer layer includes at least one of silicon oxide and silicon nitride.

11. A fabrication method of an OLED display device, the OLED display device including a plurality of sub-pixel units, the method comprising:
   forming a first buffer layer on a base substrate; wherein in a region corresponding to the first electrode in each of the sub-pixel units, a surface of the first buffer layer on a side away from the base substrate is in a concave arc shape;
   forming a first electrode, an organic material functional layer and a second electrode sequentially, in a region of each of the sub-pixel units, on a substrate where the first buffer layer has been formed,
   wherein the first electrode is a transparent electrode, and the second electrode is a non-transparent metal electrode, wherein, in a direction parallel to the base substrate, the first electrode and the concave shape have a same size.

12. The method according to claim 11, wherein forming the first buffer layer on a base substrate includes:
   forming a first buffer layer film on the base substrate; with a shielding effect of a patterned mask, performing a dry etching on a first buffer layer film corresponding to an opening of the mask, to form the first buffer layer with a concave shape on the surface,
   wherein the opening of the mask is corresponding to a predetermined region of the sub-pixel unit, and an area of the opening on a side close to the first buffer layer film is greater than an area on a side away from the first buffer layer film.

13. The method according to claim 11, further comprising, forming a thin film transistor between the base substrate and the first buffer layer, in each of the sub-pixel units.

14. The method according to claim 12, wherein the dry etching performed on the first buffer layer film includes a plasma etching.

15. The OLED display device according to claim 2, wherein a surface of the concave portion of the first buffer layer is a curved surface bending toward a side of the base substrate.

16. The OLED display device according to claim 2, wherein a thickness of the first buffer layer is 2 μm~5 μm.

17. The OLED display device according to claim 2, wherein a material of the first buffer layer includes polyimide.

18. The OLED display device according to claim 2, wherein the sub-pixel unit further includes a thin film transistor disposed between the base substrate and the first buffer layer.

19. The OLED display device according to claim 3, wherein a thickness of the first buffer layer is 2 μm~5 μm.

20. The method according to claim 12, further comprising, forming a thin film transistor between the base substrate and the first buffer layer, in each of the sub-pixel units.

* * * * *